(12) United States Patent
Shirai et al.

(10) Patent No.: US 9,595,483 B2
(45) Date of Patent: Mar. 14, 2017

(54) CUTTING DEVICE AND CUTTING METHOD

(71) Applicant: TOWA CORPORATION, Kyoto-shi, Kyoto (JP)

(72) Inventors: Katsumasa Shirai, Kyoto (JP); Hiroto Mochizuki, Kyoto (JP); Kanji Ishibashi, Kyoto (JP)

(73) Assignee: TOWA CORPORATION, Kyoto (JP)

( * ) Notice: Subject to any disclaimer, the term of this patent is extended or adjusted under 35 U.S.C. 154(b) by 0 days.

(21) Appl. No.: 15/078,914

(22) Filed: Mar. 23, 2016

(65) Prior Publication Data

US 2016/0284612 A1  Sep. 29, 2016

(30) Foreign Application Priority Data

Mar. 25, 2015 (JP) .................. 2015-062011

(51) Int. Cl.
| | |
|---|---|
| *H01L 21/00* | (2006.01) |
| *H01L 21/66* | (2006.01) |
| *B26D 5/00* | (2006.01) |
| *B26D 7/01* | (2006.01) |
| *H01L 21/78* | (2006.01) |
| *H01L 21/68* | (2006.01) |
| *H01L 21/67* | (2006.01) |

(52) U.S. Cl.
CPC .............. *H01L 22/20* (2013.01); *B26D 5/007* (2013.01); *B26D 7/01* (2013.01); *H01L 21/67092* (2013.01); *H01L 21/681* (2013.01); *H01L 21/78* (2013.01)

(58) Field of Classification Search
CPC . H01L 21/20; H01L 21/681; H01L 21/67092; H01L 21/78; B26D 5/007; B26D 7/01
See application file for complete search history.

(56) References Cited

U.S. PATENT DOCUMENTS

2004/0083868 A1* 5/2004 Ohmiya ................. B23Q 11/08
83/168
2005/0072766 A1* 4/2005 Arita ................... H01L 21/6836
219/121.44

FOREIGN PATENT DOCUMENTS

JP 2009-170501 7/2009

* cited by examiner

*Primary Examiner* — Richard Booth
(74) *Attorney, Agent, or Firm* — Procopio Cory Hargreaves & Savitch LLP

(57) ABSTRACT

A cutting device includes: an imaging module for capturing first marks and third marks, to produce primary image data; and a control module for aligning, by a conveyance mechanism, a cutting jig and an object to be cut that is placed on the cutting jig. The control module compares first positional information including positional information of a specific first mark stored or first positional information with third positional information to calculate a primary displacement amount showing a relative positional displacement between a plurality of cutting grooves and the plurality of third marks, respectively. The conveyance mechanism picks up the object from the cutting jig, and the conveyance mechanism and the cutting jig are moved relative to each other based on the primary displacement amount, to move the object by the primary displacement amount to a primary target position. The cutting mechanism cuts the object along a plurality of cutting lines.

5 Claims, 9 Drawing Sheets

$(dX-X0) \cong 0 \; (\ll T1)$ AND
$(dY-Y0) \cong 0 \; (\ll T1)$ $0 < (dX-X0) < T1$ AND
$0 < (dY-Y0) < T1$ $$(dX-X0) > T1 \text{ AND } (dY-Y0) > T1$$

$$-(dX-X0) > T1 \text{ AND } -(dY-Y0) > T1$$

CUTTING DEVICE AND CUTTING METHOD

BACKGROUND OF THE INVENTION

Field of the Invention

The present invention relates to a cutting device and a cutting method for cutting an object to be cut to manufacture a plurality of singularized products.

Description of the Background Art

A substrate made of a printed circuit board, a lead frame or the like is imaginarily partitioned into a plurality of lattice-shaped regions. Then, after one chip-shaped element or a plurality of chip-shaped elements (for example, a semiconductor chip) is/are mounted on each of the regions, the entire substrate is resin-sealed. The resulting product obtained in this way is referred to as a "sealed substrate". The sealed substrate is cut by a cutting mechanism employing a rotary blade or the like and singularized into region units, each of which is provided as a product.

Conventionally, a cutting device has been used to cut a prescribed region of the sealed substrate by a cutting mechanism such as a rotary blade. First, the sealed substrate is placed on a cutting table. Then, the sealed substrate is aligned (positioned). By such alignment, the position of each imaginary cutting line for partitioning the sealed substrate into a plurality of regions is set. Then, the cutting table on which the sealed substrate is placed and the cutting mechanism are moved relative to each other. While cutting water is sprayed onto to an area of the sealed substrate that should be cut, the sealed substrate is cut by the cutting mechanism along each cutting line defined on the sealed substrate. The sealed substrate is cut, thereby manufacturing singularized products.

The cutting table is equipped with a cutting jig adaptable to products. The sealed substrate is placed on the cutting jig and adhered thereto by means of vacuum sucking. The cutting jig is provided with a plurality of platform-shaped protrusions sucking a plurality of regions, respectively, in the sealed substrate so as to be held thereon. The plurality of protrusions are provided with sucking holes, respectively. Between the protrusions, a plurality of cutting grooves are provided that correspond to the positions of the plurality of cutting lines, respectively, partitioning the sealed substrate into a plurality of regions. The cutting table and the cutting mechanism move relative to each other, so that the sealed substrate is cut along the plurality of cutting lines and thereby singularized.

When the sealed substrate is cut, each cutting line of the sealed substrate is aligned with the position of each cutting groove on the cutting jig. The rotary blade is moved along each cutting line to thereby cut the sealed substrate. When the sealed substrate is cut in the state where the position of a cutting groove on the cutting jig and the position of a cutting line on the sealed substrate are displaced from each other, the rotary blade may be displaced from the position of the cutting groove, so that a part of the cutting jig may be shaved. The cutting jig is shaved, so that a large amount of scraps are generated. Furthermore, the cutting jig is shaved, thereby shortening the life of the cutting jig. Therefore, it becomes important to cut the sealed substrate while accurately aligning the position of each cutting line on the sealed substrate with the position of each cutting groove on the cutting jig.

As a cutting device capable of holding a workpiece on a holding table so as to align dividing lines with the positions of cutting blade clearance grooves, respectively, even if each dividing line undergoes a pattern displacement, there is a proposed cutting device "comprising: a rotatable holding table holding a workpiece, the holding table having a cutting blade clearance groove formed at a position corresponding to a dividing line on the surface of the workpiece; cutting means having a cutting blade for cutting the workpiece held in the holding table along the dividing line; and conveying means for conveying the workpiece onto the holding table, the cutting device further comprising control means for controlling the conveying means or the holding table to cause the workpiece to be held on the holding table while aligning the dividing line on the surface of the workpiece recognized by imaging module with the position of the cutting blade clearance groove on the holding table (for example, see paragraph [0009], FIGS. 1, 4 and 5 in Japanese Patent Laying-Open No. 2009-170501).

As shown in FIGS. 4 and 5 in Japanese Patent Laying-Open No. 2009-170501, the surface of workpiece 60 is captured by imaging module 13, thereby recognizing the state of each dividing line 61. Then, based on this recognition result, the amount of conveying the conveying means 20 and the posture/position of holding table 30 are controlled such that workpiece 60 is held on holding table 30 while aligning each dividing line 61 with the position of each cutting blade clearance groove 32. Accordingly, even if workpiece 60 undergoes a pattern displacement of each dividing line 61, workpiece 60 can be held on holding table 30 such that each dividing line 61 is aligned with the position of each cutting blade clearance groove 32. Therefore, an excellent full-cutting operation can be performed in the state where the positions of cutting blade 41, each dividing line 61 and each cutting blade clearance groove 32 are aligned with one another.

According to cutting device 10 disclosed in Japanese Patent Laying-Open No. 2009-170501, however, the following problems arise. For example, in a sealed substrate as a semi-finished product obtained when a product (a semiconductor device) referred to as a BGA (Ball Grid Array) is manufactured (this sealed substrate will be hereinafter referred to as a "BGA substrate"), a large number of solder balls electrically connected to the outside are formed on the substrate. In this BGA substrate, a solder ball may be formed at a position displaced from the position of a dividing line. If the BGA substrate is cut in the state where the position of the solder ball is displaced from the dividing line, a part of the solder ball may be damaged. When the solder ball is damaged, the quality of a singularized BGA product is deteriorated, so that a defective product may be produced.

SUMMARY OF THE INVENTION

An embodiment of the present invention aims to provide a cutting device and a cutting method for preventing occurrence of a defective product by correcting the position at which an object to be cut is cut, even when the position of an external electrode electrically connected to the outside is displaced from a cutting line set relative to the object to be cut having this external electrode.

A cutting device used when manufacturing a plurality of products by cutting an object to be cut according to an embodiment of the present invention includes: a cutting jig having a plurality of first marks and a plurality of cutting grooves and on which an object to be cut is placed, the object having a plurality of second marks and a plurality of third marks formed of a plurality of external electrodes; a cutting mechanism for cutting the object, which is placed on the cutting jig, along a plurality of cutting lines; a conveyance mechanism for conveying the object; a movement mechanism for moving the cutting jig and the cutting mechanism relative to each other; an imaging module for capturing at least the plurality of first marks and the plurality of third marks, to produce primary image data; and a control module for causing the conveyance mechanism align the cutting jig and the object that is placed on the cutting jig. The control module compares (a) first positional information including positional information of a specific first mark stored or (b) first positional information including positional information of a specific first mark obtained by image-processing the primary image data, with third positional information including positional information of a specific third mark measured based on the primary image data, to calculate a primary displacement amount showing a relative positional displacement between the plurality of cutting grooves and the plurality of third marks, respectively. The conveyance mechanism moves the object to a primary target position depending on the primary displacement amount by means that the object is picked up from the cutting jig and the conveyance mechanism and the cutting jig are moved relative to each other based on the primary displacement amount, and then the conveyance mechanism again places the object on the cutting jig. The cutting mechanism cuts the object, which is placed again, along the plurality of cutting lines.

In the cutting device according to an embodiment of the present invention, before producing the primary image data, the imaging module captures at least the plurality of second marks to produce primitive image data. Before producing the primary image data, the control module compares the first positional information and second positional information including positional information of a specific second mark measured based on the primitive image data, to calculate a primitive displacement amount showing a relative positional displacement between the plurality of cutting grooves and the plurality of second marks, respectively. Before producing the primary image data, the conveyance mechanism moves the object to a primitive target position depending on the primitive displacement amount by means that the object is picked up from the cutting jig and the conveyance mechanism and the cutting jig are moved relative to each other based on the primitive displacement amount. Then, the conveyance mechanism again places the object on the cutting jig.

In the cutting device according to an embodiment of the present invention, the object is moved to the primitive target position or the primary target position in at least one of an X direction, a Y direction and a θ direction by means that the conveyance mechanism and the cutting jig are moved relative to each other. Then, the conveyance mechanism again places the object on the cutting jig.

In the cutting device according to an embodiment of the present invention, at least two specific first marks are set in each of a first direction and a second direction that is orthogonal to the first direction as seen in plan view. At least two specific second marks are set in each of the first direction and the second direction as seen in plan view. At least two specific third marks are set in each of the first direction and the second direction as seen in plan view.

In the cutting device according to an embodiment of the present invention, the object is a sealed substrate used when manufacturing a BGA, and the external electrode is an electrode having a protruded shape.

In order to solve the above-described problems, a cutting method according to an embodiment of the present invention includes the steps of: preparing a cutting jig having a plurality of cutting grooves and a plurality of first marks; preparing an object to be cut having a plurality of cutting lines, a plurality of second marks, and a plurality of third marks formed of a plurality of external electrodes; placing the object on the cutting jig by a conveyance mechanism; capturing the plurality of first marks and the plurality of third marks by an imaging module, to produce primary image data; obtaining first positional information including positional information of a specific first mark stored or first positional information including positional information of a specific first mark obtained by image-processing the primary image data; obtaining third positional information including positional information of a specific third mark obtained by image-processing the primary image data; comparing the first positional information and the third positional information, to calculate a primary displacement amount showing a relative positional displacement between the plurality of cutting grooves and the plurality of third marks, respectively; picking up the object from the cutting jig, and moving the object to a primary target position depending on the primary displacement amount; again placing the object on the cutting jig; and moving the cutting jig and a cutting mechanism relative to each other to cut the object, which is placed again, along the plurality of cutting lines using the cutting mechanism.

The cutting method according to an embodiment of the present invention includes the steps of: before the step of obtaining primary image data, capturing at least the plurality of second marks to produce primitive image data; before the step of obtaining primary image data, comparing the first positional information and second positional information that includes positional information of a specific second mark measured based on the primitive image data, to calculate a primitive displacement amount showing a relative positional displacement between the plurality of cutting grooves and the plurality of second marks, respectively; before the step of obtaining primary image data, picking up the object from the cutting jig, and moving the object to a primitive target position depending on the primitive displacement amount; and before the step of obtaining primary image data, again placing the object that has been moved to the primitive target position.

In the cutting method according to an embodiment of the present invention, the step of moving the object includes the step of moving the object to the primitive target position or the primary target position in at least one of an X direction, a Y direction and a θ direction by means that the conveyance mechanism and the cutting jig are moved relative to each other.

The cutting method according to an embodiment of the present invention further includes the steps of: setting at least two specific first marks of the plurality of first marks in each of a first direction and a second direction that is orthogonal to the first direction as seen in plan view; setting at least two specific second marks of the plurality of second marks in each of the first direction and the second direction as seen in plan view; and setting at least two specific third marks of the plurality of third marks in each of the first direction and the second direction as seen in plan view.

In the cutting method according to an embodiment of the present invention, the object is a sealed substrate used when manufacturing a BGA, and the external electrode is an electrode having a protruded shape.

According to an embodiment of the present invention, a conveyance mechanism is used to place an object to be cut having a third mark on a cutting jig having a first mark. An imaging module is used to obtain positional information of a specific first mark formed in the cutting jig and positional information of a specific third mark formed in the object. A control module compares the positional information of the specific first mark and the positional information of the specific third mark, to calculate a relative displacement amount between a cutting groove provided in the cutting jig and a third mark formed in the object. The conveyance mechanism picks up the object from the cutting jig. Then, the conveyance mechanism and the cutting jig are moved relative to each other based on the displacement amount, thereby moving the object to a target position. The conveyance mechanism again places the object on the cutting jig, and the cutting mechanism cuts the object along a cutting line. Thereby, the object can be accurately cut along the cutting line without damaging the third mark. Therefore, occurrence of a defective product can be prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A and 2B are overview diagrams each showing a BGA substrate (sealed substrate) used in the cutting device according to the first embodiment of the present invention, in which FIG. 2A shows a plan view seen from the substrate side and FIG. 2B shows a front view.

FIGS. 3A and 3B are overview diagrams each showing a cutting jig adaptable to the BGA substrate shown in each of FIGS. 2A and 2B, in which FIG. 3A shows a plan view and FIG. 3B shows a cross-sectional view taken along a line A-A in FIG. 3A.

FIGS. 4A and 4B are overview diagrams each showing the state where the BGA substrate is placed on the cutting jig in the cutting device according to the first embodiment of the present invention, in which FIG. 4A shows a plan view and FIG. 4B shows a cross-sectional view.

FIGS. 5A to 5D are schematic diagrams each showing the positional relation between solder balls and cutting lines in the cutting device according to the first embodiment of the present invention, in which FIG. 5A is a plan view showing the state where solder balls are not displaced, FIG. 5B is a plan view showing the state where solder balls are slightly displaced, FIG. 5C is a plan view showing the state where solder balls are displaced beyond a permissible value, and FIG. 5D is a plan view showing the state where the displacement amount of each solder ball is corrected to set a new cutting line on the BGA substrate.

DESCRIPTION OF THE PREFERRED EMBODIMENTS

Outline

Figure 4A:
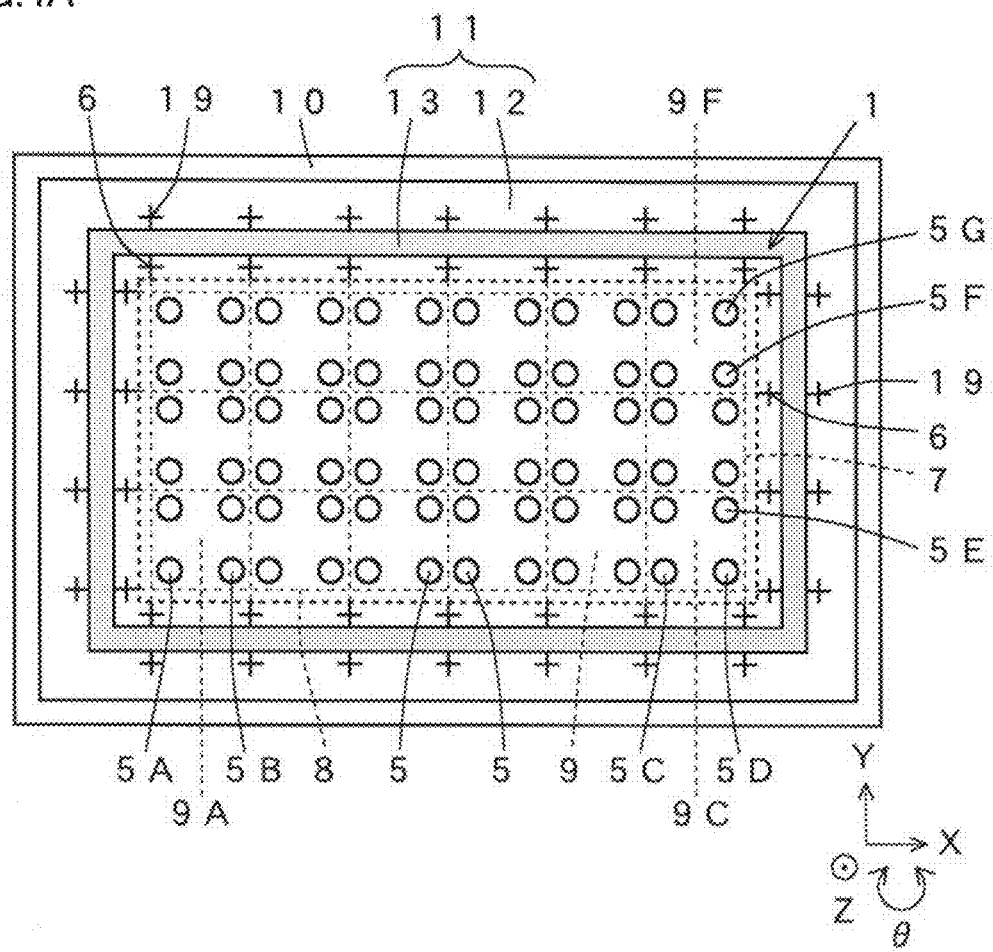
Figure 4B:
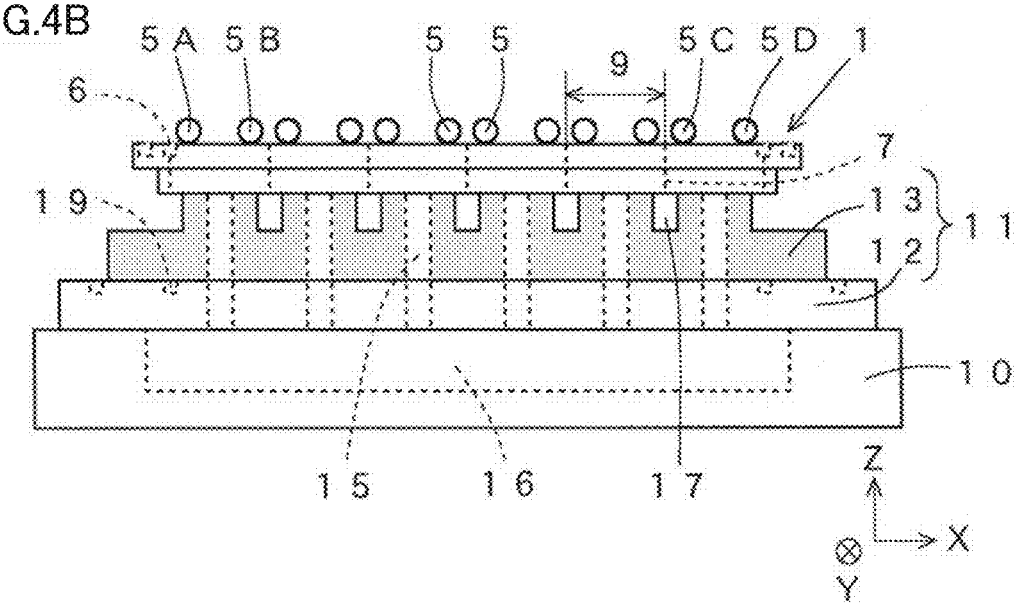

Typically, as shown in FIGS. 4A and 4B, in a cutting device, a cutting jig 11 having first marks 19 formed thereon is mounted on a cutting table 10. A BGA substrate 1 having second marks 6 and solder balls 5 formed thereon is placed on cutting jig 11. An imaging module is used to measure a coordinate position of each first mark 19, a coordinate position of each second mark 6 and a coordinate position of each solder ball 5. The cutting device compares the coordinate position of each first mark 19, the coordinate position of each second mark 6 and the coordinate position of each solder ball 5, to calculate a relative displacement amount between each cutting groove provided in the cutting jig and each solder ball formed in BGA substrate 1. A conveyance mechanism is used to pick up BGA substrate 1, move BGA substrate 1 by an appropriate amount based on the relative displacement amount, and again place BGA substrate 1 on cutting jig 11. Thereby, a new cutting line is set on a line connecting intermediate points each located between solder balls 5 formed in regions 9 adjacent to each other. Each new cutting line is aligned with the position of each cutting groove in cutting jig 11. BGA substrate 1 is cut along each new cutting line, so that occurrence of a defective product can be prevented without damaging solder ball 5.

First Embodiment

The cutting device according to the first embodiment of the present invention will be hereinafter described with reference to FIGS. 1, 2A, 2B, 3A, 3B, 4A, 4B, 5A to 5D, 6A, and 6B. Each of the figures in the document of the present application is also schematically illustrated with appropriate omission or exaggeration for ease of understanding. The same components are designated by the same reference characters and the description thereof will not be repeated as appropriate.

Figure 1:
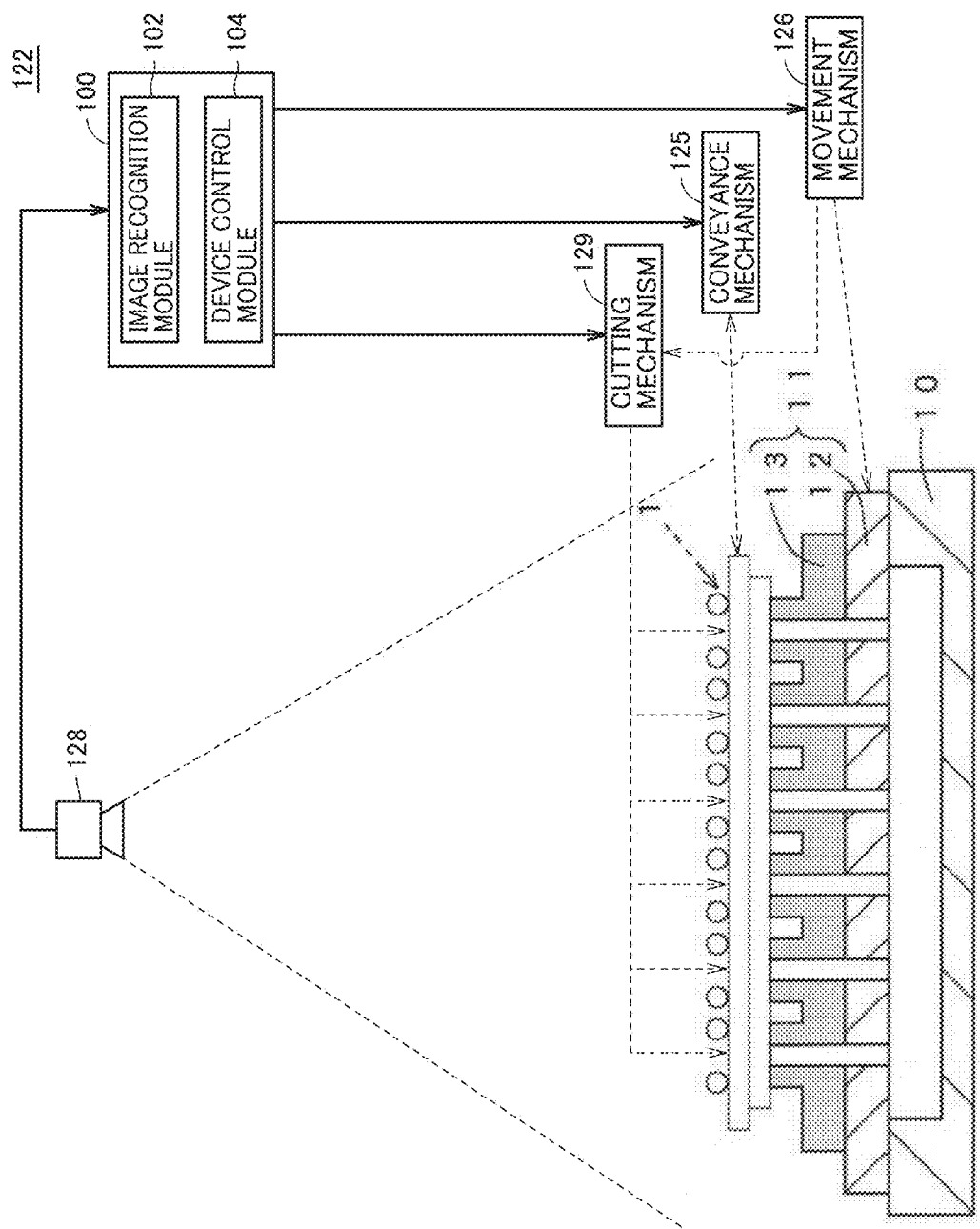
FIG. 1 is a schematic diagram showing a schematic configuration of a cutting device according to the first embodiment of the present invention.

A cutting device 122 according to the first embodiment of the present invention is used when manufacturing a plurality of products by cutting an object to be cut (typically, BGA substrate 1). As shown in FIG. 1, cutting device 122 includes: a cutting jig 11 on which the object to be cut is placed; a cutting mechanism 129 cutting the object to be cut, which is placed on cutting jig 11, along a plurality of cutting lines; a conveyance mechanism 125 conveying the object to be cut; and a movement mechanism 126 moving cutting jig 11 and cutting mechanism 129 relative to each other. Cutting device 122 further includes a camera 128 as an example of an imaging module. Camera 128 is arranged such that an object to be cut is included in an imaging view. Cutting device 122 further includes a controller 100 for controlling cutting mechanism 129, conveyance mechanism 125 and movement mechanism 126 while receiving image information taken by camera 128. Controller 100 has a storage unit for storing necessary data.

Controller 100 includes, as its functional modules, an image recognition module 102 performing image recognition of the image information taken by camera 128, and a device control module 104 controlling each mechanism based on the results of image recognition performed in image recognition module 102. These functional modules may be typically implemented by a processor, which forms controller 100, executing a program, or implemented using a circuit configuration implemented by hardware such as an ASIC (Application Specific Integrated Circuit) or an LSI (Large Scale Integration).

Figure 2A:
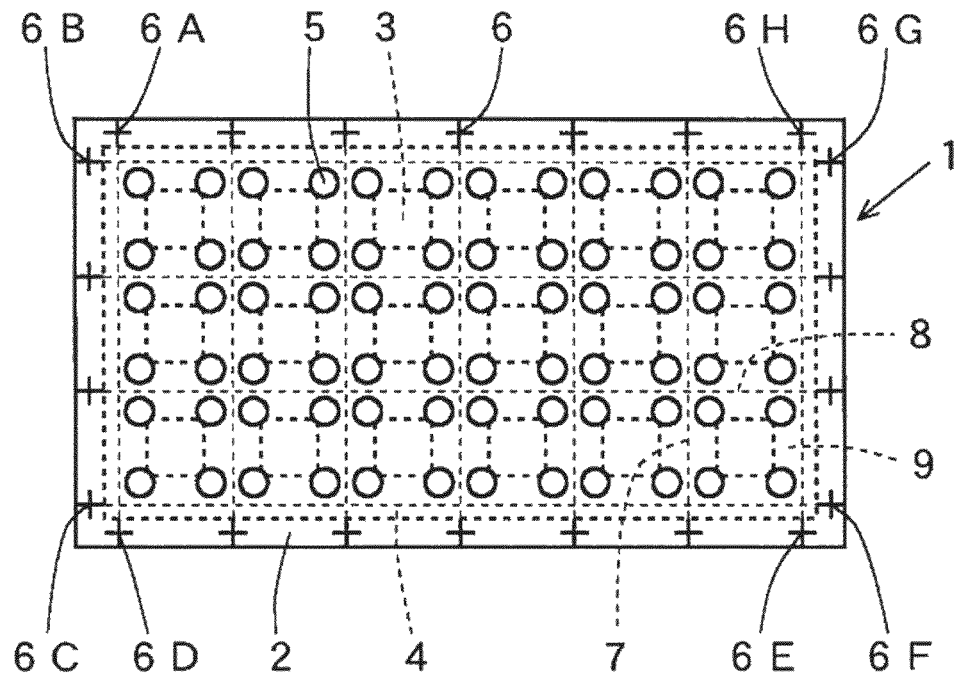
Figure 2B:
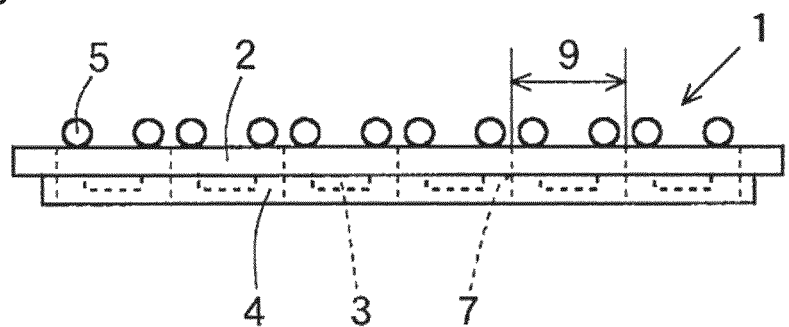

As shown in FIGS. 2A and 2B, BGA substrate 1 is one example of the object to be cut that is finally cut and singularized. BGA substrate 1 is a sealed substrate used when manufacturing a BGA product (a semiconductor device). BGA substrate 1 has a substrate 2 formed of a printed circuit board or the like, a plurality of semiconductor chips 3 mounted in a plurality of regions (described later) included in substrate 2, and a sealing resin 4 formed so as to collectively cover the plurality of regions. On the surface of substrate 2, a large number of solder balls 5 each serving as an external electrode for connecting to the outside are formed inside each of the regions. A large number of solder balls 5 each serving as a substrate having a protruded shape are electrically connected through a wire or an interconnection (not shown) to their respective pad electrodes (not shown) provided in semiconductor chip 3.

As shown in FIGS. 2A and 2B, in substrate 2 included in BGA substrate 1, second marks 6A, 6B, . . . , 6G, and 6H (marks each shown by a symbol + in the figures and hereinafter collectively referred to as a "second mark 6" as appropriate; the same applies to other components) including a plurality of alignment marks are formed in each of the longer direction and the shorter direction of substrate 2. Second mark 6 is arbitrarily set depending on the size and the number of the product. Second mark 6 is captured by alignment camera 128, and the coordinate position thereof is measured by image recognition. The coordinate position is measured, so that BGA substrate 1 is aligned with a cutting jig (described later). Second marks 6 formed in four corners of BGA substrate 1 are generally used for alignment. In FIG. 2A, eight second marks 6 formed in four corners of BGA 2A are designated as 6A, 6B, . . . , 6G, and 6H, respectively, in order in the counterclockwise direction starting from the upper left point of BGA substrate 1.

A plurality of first cutting lines 7 extending in the shorter direction are imaginarily set such that each first cutting line 7 connects second marks 6 that are formed so as to face each other in the shorter direction of BGA substrate 1. A plurality of second cutting lines 8 extending in the longer direction are imaginarily set such that each second cutting line 8 connects second marks 6 that are formed so as to face each other in the longer direction of BGA substrate 1. A plurality of regions 9 surrounded by the plurality of first cutting lines 7 and the plurality of second cutting lines 8 correspond to products, respectively, that are produced by singularization. In FIG. 2A, for example, seven first cutting lines 7 extending in the shorter direction are set while four second cutting lines 8 extending in the longer direction are set. Therefore, three regions 9 are formed in the shorter direction while six regions 9 are formed in the longer direction, which leads to formation of a total of eighteen regions 9 in a lattice shape. A large number of solder balls 5 are formed inside each region 9. In the figure, four solder balls 5 are represented in each region 9. Regions 9 formed in BGA substrate 1 are arbitrarily set depending on the size and the number of singularized products.

Figure 3A:
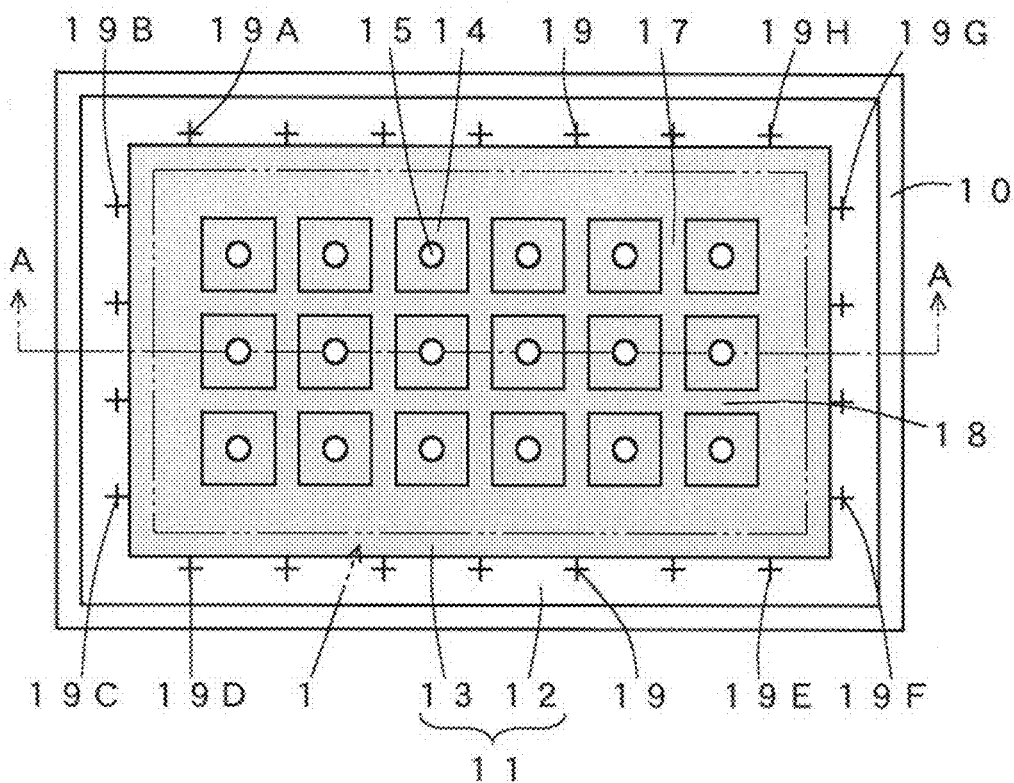
Figure 3B:
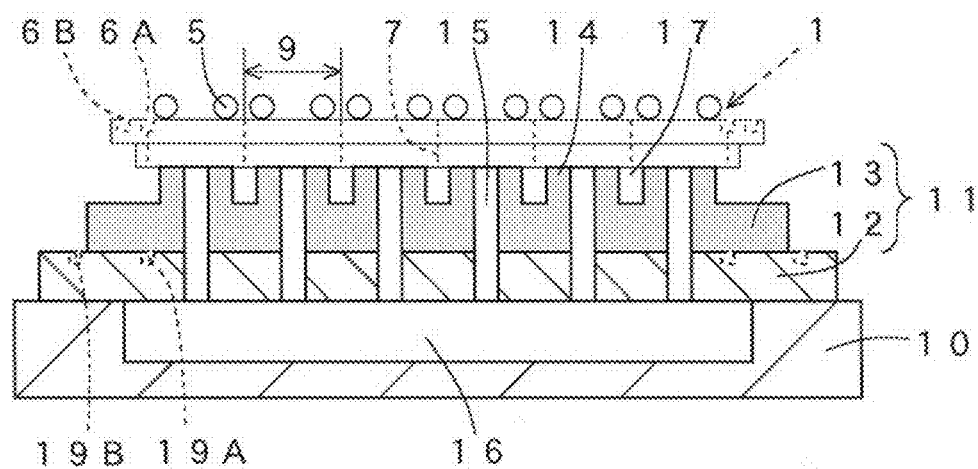

As shown in FIGS. 3A and 3B, cutting table 10 serves to cut and singularize BGA substrate 1 in the cutting device. Cutting table 10 is equipped with cutting jig 11 adaptable to a product. Cutting jig 11 includes a metal plate 12 and a resin sheet 13 fixed on metal plate 12. Resin sheet 13 needs to have proper flexibility in order to alleviate a mechanical impact. It is preferable that resin sheet 13 is formed, for example, of silicone-based resin, fluorine-based resin or the like. It is preferable that cutting table 10 is used common to a plurality of products and only cutting jig 11 is replaced depending on products.

Resin sheet 13 on cutting jig 11 is provided with a plurality of platform-shaped protrusions 14 sucking and holding a plurality of regions 9, respectively, in BGA substrate 1. Cutting jig 11 is provided with a plurality of sucking holes 15 that penetrate from the surfaces of the plurality of protrusions 14 through resin sheet 13 and metal plate 12. Each of the plurality of sucking holes 15 leads to space 16 provided in cutting table 10. Space 16 is connected to a suction mechanism (not shown) provided outside.

A plurality of first cutting grooves 17 and a plurality of second cutting grooves 18 each are provided between protrusions 14 so as to correspond to the plurality of first cutting lines 7 and the plurality of second cutting lines 8, respectively, (see FIGS. 2A and 2B) partitioning BGA substrate 1 into a plurality of regions 9. The plurality of first cutting grooves 17 are formed so as to extend in the shorter direction of resin sheet 13 (cutting jig 11). The plurality of second cutting grooves 18 are formed so as to extend in the longer direction of resin sheet 13 (cutting jig 11). For first cutting lines 7 and second cutting lines 8 set on the outermost sides in BGA substrate 1, the space on the outside of each protrusion 14 formed in the outermost circumference of resin sheet 13 plays the same role as a cutting groove.

As shown in FIG. 3A, a plurality of first marks 19 (marks each shown by a symbol + in FIG. 3A) are formed in metal plate 12 in each of the longer direction and the shorter direction to surround resin sheet 13, so as to be capable of corresponding to the positions of second marks 6 (see FIG. 2A) provided in BGA substrate 1. For example, first marks 19A, 19B, . . . , 19G, and 19H are formed in four corners of metal plate 12 so as to be capable of corresponding to the positions of second marks 6A, 6B, . . . , 6G, and 6H (see FIG. 2A) provided in four corners of BGA substrate 1. Furthermore, the required number of first marks 19 may be formed in the longer direction and the shorter direction so as to be capable of corresponding to second marks 6 formed in BGA substrate 1.

A plurality of first cutting grooves 17 each are formed on a line connecting two facing first marks 19 formed in the shorter direction of metal plate 12 (cutting jig 11). A plurality of second cutting grooves 18 each are formed on a line connecting two facing first marks 19 formed in the longer direction of metal plate 12 (cutting jig 11).

In FIG. 3A, first marks 19 are formed in metal plate 12 so as to be capable of corresponding to second marks 6, respectively, formed in BGA substrate 1. Without limiting to the above, first marks 19 may be formed in resin sheet 13 so as to correspond to the positions of second marks 6, respectively, formed in BGA substrate 1.

Then, the process of placing BGA substrate 1 on cutting jig 11 and cutting this BGA substrate 1 will be hereinafter described. As shown in FIGS. 4A and 4B, cutting jig 11 is mounted on cutting table 10, and BGA substrate 1 is placed on cutting jig 11. Therefore, the positional information of first mark 19 formed in metal plate 12 of cutting jig 11 and the positional information of second mark 6 formed in BGA substrate 1 can be measured as positional information (coordinate position) in cutting table 10 (cutting jig 11). In the first embodiment, an explanation will be given with regard to the case where the longer direction of cutting table 10 is arranged in the X direction while the shorter direction of cutting table 10 is arranged in the Y direction.

First, as shown in FIGS. 3A and 3B, in the state where BGA substrate 1 is not placed in cutting jig 11, first mark 19 formed in metal plate 12 is captured by alignment camera 128 to obtain image data. The coordinate position of first mark 19 is measured by performing image recognition based on the image data. The coordinate position of measured first mark 19 is stored in controller 100 in advance as a reference coordinate position in cutting table 10. For example, the coordinate positions of eight first marks 19A, 19B, . . . , 19G, and 19H formed in four corners of metal plate 12 are stored in advance.

This process may be performed each time BGA substrate 1 may be placed on cutting jig 11, and the coordinate position of first mark 19 may be stored each time. Then, the stored coordinate position of first mark 19 may be read in the subsequent process. Alternatively, this process may be performed at the time when cutting jig 11 is replaced. Then, the coordinate position of first mark 19 may be stored, and the stored coordinate position may be read each time BGA substrate 1 is placed on cutting jig 11.

Then, as shown in FIGS. 4A and 4B, a conveyance mechanism (see conveyance mechanism 125 in FIG. 1) is used to place BGA substrate 1 on cutting table 10. In the state where BGA substrate 1 is placed on cutting jig 11, second mark 6 formed in BGA substrate 1 is captured to obtain image data. Image recognition is performed based on the image data to measure the coordinate position of second mark 6. For example, the coordinate positions of eight second marks 6A, 6B, . . . , 6G, and 6H (see FIG. 2A) formed in four corners are measured. The coordinate positions of these measured second marks 6 are compared with the coordinate positions of first marks 19 measured and stored in advance. This allows calculation of the displacement amount in cutting jig 11, which results from the positional displacement of BGA substrate 1 in each of the X direction, the Y direction and the θ direction.

In this process, first mark 19 and second mark 6 may be simultaneously captured to obtain image data. In this case, image data is obtained each time BGA substrate 1 is placed on cutting jig 11, which is followed by image recognition based on the image data, to thereby measure the coordinate position of first mark 19 and the coordinate position of second mark 6, which are stored in each measurement. Then, the coordinate position of first mark 19 and the coordinate position of second mark 6 that have been stored are read and compared with each other.

Controller 100 determines whether the calculated displacement amounts in the X direction, the Y direction and the θ direction fall within a range of a permissible value that has been set in advance. If all of the displacement amounts fall within the range of the permissible value, the process proceeds to the next stage. If any one of the displacement amounts in the X direction, the Y direction and the θ direction falls beyond the permissible value, such a displacement amount is corrected in advance.

In order to correct the displacement amount of BGA substrate 1 in advance, the conveyance mechanism (see conveyance mechanism 125 in FIG. 1) is first used to pick up BGA substrate 1 from cutting jig 11 by means of vacuum sucking or the like, and set BGA substrate 1 to be held in the conveyance mechanism. Then, in the state where BGA substrate 1 is not placed on cutting jig 11 but held in the conveyance mechanism, the conveyance mechanism is moved by an appropriate amount depending on the displacement amount in at least one of the X direction, the Y direction and the θ direction. By this movement, BGA substrate 1 is moved by the displacement amount to a target position. The target position is defined as a position where the displacement amount is zero or where the displacement amount is decreased to a value close to zero as compared with the position before movement (the value falling within the permissible value). Then, BGA substrate 1 is again placed on cutting jig 11 using the conveyance mechanism. By the process described so far, correction of the displacement amount in BGA substrate 1 is completed.

As shown in FIGS. 4A and 4B, the displacement amount is corrected in advance, so that the position of second mark 6 in BGA substrate 1 can be accurately aligned so as to correspond to the position of first mark 19 in cutting jig 11. More specifically, the positional relation between first mark 19 and second mark 6 can be established in a prescribed positional relation. The positions of the plurality of first cutting lines 7 and the plurality of second cutting lines 8 set in BGA substrate 1 can be accurately aligned with the positions of the plurality of first cutting grooves 17 and the plurality of second cutting grooves 18, respectively, provided in cutting jig 11. Therefore, in this state, the coordinate positions of the plurality of first cutting grooves 17 and the plurality of second cutting grooves 18 approximately coincide with the coordinate positions of the plurality of first cutting lines 7 and the plurality of second cutting lines 8.

Then, a camera for alignment or a camera for kerf checking provided in the cutting mechanism (camera 128 in FIG. 1) is used to image solder balls 5 formed in BGA substrate 1, thereby obtaining image data. The coordinate position of each solder ball 5 is measured by performing image recognition based on the image data. For example, as shown in FIGS. 4A and 4B, the coordinate positions of solder balls 5A, 5B, 5C, and 5D formed in the longer direction of BGA substrate 1 are measured. These coordinate positions are compared with the coordinate positions of second cutting lines 8 extending in the longer direction, so that the distances from second cutting lines 8 to solder balls 5 can be calculated. By comparing these distances with the distance extending from the cutting line to the solder ball in a product and stored in controller 100 in advance (a specification value of the product), it becomes possible to calculate the displacement amount of solder ball 5 resulting from the positional displacement occurring when each solder ball 5 is formed in BGA substrate 1. In this process, solder ball 5 is used as the third mark that is an object to be captured.

The coordinate positions of solder balls 5A and 5B are measured, so that it becomes possible to calculate the displacement amounts of solder balls 5A and 5B relative to second cutting lines 8 extending in the longer direction within region 9A. The coordinate positions of solder balls 5C and 5D are measured, so that it becomes possible to calculate the displacement amounts of solder balls 5C and 5D relative to second cutting lines 8 within region 9C. These displacement amounts are equalized, thereby calculating the displacement amount of each solder ball 5 relative to each second cutting line 8 extending in the longer direction.

Then, the coordinate positions of solder balls 5D, 5E, 5F, and 5G formed in the shorter direction of BGA substrate 1 are measured. These coordinate positions are compared with the coordinate positions of first cutting lines 7 extending in the shorter direction, so that the distance from each first cutting line 7 to each solder ball 5 can be calculated. By comparing this distance with the distance extending from each cutting line to each solder ball in a product and stored in controller 100 in advance (a specification value of the product), the displacement amount of solder ball 5 can be calculated.

By measuring the coordinate positions of solder balls 5D and 5E, it becomes possible to calculate the displacement amounts of solder balls 5D and 5E relative to first cutting lines 7 extending in the shorter direction within region 9C. By measuring the coordinate positions of solder balls 5F and 5G, it becomes possible to calculate the displacement amounts of solder balls 5F and 5G relative to first cutting lines 7 within region 9F. These displacement amounts are equalized, thereby calculating the displacement amount of solder ball 5 relative to first cutting line 7 extending in the shorter direction.

Controller 100 determines whether the displacement amount of solder ball 5 calculated relative to first cutting line 7 extending in the shorter direction and second cutting line 8 extending in the longer direction fall within the permissible range or not with respect to the specification value of the product.

Referring to FIGS. 5A to 5D, the operation of measuring and correcting the positional displacement of solder ball 5 will be hereinafter described. First cutting line 7 set in the shorter direction of BGA substrate 1 is accurately aligned in advance with the position of first cutting groove 17 formed in the shorter direction of cutting jig 11. Second cutting line 8 set in the longer direction of BGA substrate 1 is accurately aligned in advance with the position of second cutting groove 18 formed in the longer direction of cutting jig 11. In this state, the positional displacement of solder ball 5 is measured and corrected.

Figure 5A:
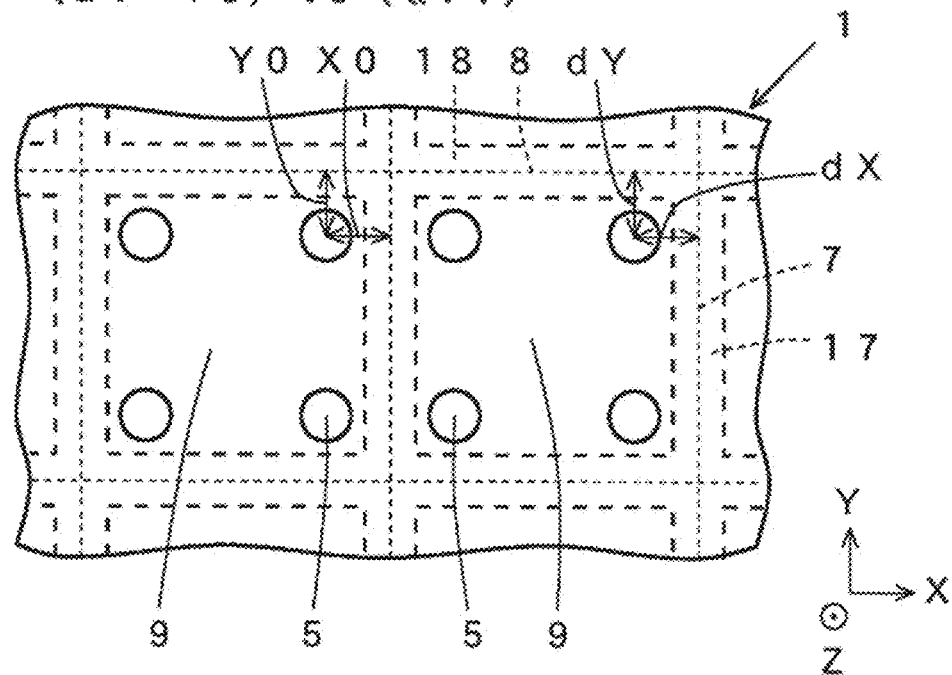

In FIG. 5A, the distance from first cutting line 7 extending in the shorter direction to the center of solder ball 5 is defined as dX while the distance from second cutting line 8 extending in the longer direction to the center of solder ball 5 is defined as dY. The camera for alignment or the camera for kerf checking (camera 128 in FIG. 1) is used to measure the coordinate position of solder ball 5. Thereby, it becomes possible to calculate distance dX from first cutting line 7 to solder ball 5 and distance dY from second cutting line 8 to solder ball 5. Calculated distance dX and distance dY are compared with distance X0 and distance Y0, respectively, that are specification values of the product stored in advance, thereby calculating displacement amounts (dX−X0) and (dY−Y0) of solder balls 5. Controller 100 determines whether these displacement amounts (dX−X0) and (dY−Y0) fall within the permissible range in the product. In addition, distance X0 and distance Y0 as specification values of the product stored in advance establish the relation of X0=Y0 (>0), for example.

For example, the permissible value of the displacement amount from each of first cutting line 7 and second cutting line 8 to the center of solder ball 5 in the product is defined as T1. If 0≤(dX−X0)<T1 and 0≤(dY−Y0)<T1, controller 100 determines that the displacement amount of solder ball 5 relative to each of first cutting line 7 and second cutting line 8 falls within the permissible range. In this case, BGA substrate 1 is cut and singularized along first cutting line 7 extending in the shorter direction of BGA substrate 1 and second cutting line 8 extending in the longer direction thereof. Since the displacement amount of solder ball 5 relative to each of first cutting line 7 and second cutting line 8 falls within the permissible range, no defective product is produced.

FIG. 5A shows the case where (dX−X0)≈0 (<<0) and (dY−Y0)≈0 (<<0). In this case, solder ball 5 is not substantially displaced relative to first cutting line 7 and second cutting line 8 in each of the X direction and the Y direction. Therefore, BGA substrate 1 is cut and singularized along first cutting line 7 extending in the shorter direction of BGA substrate 1 and second cutting line 8 extending in the longer direction thereof.

Figure 5B:
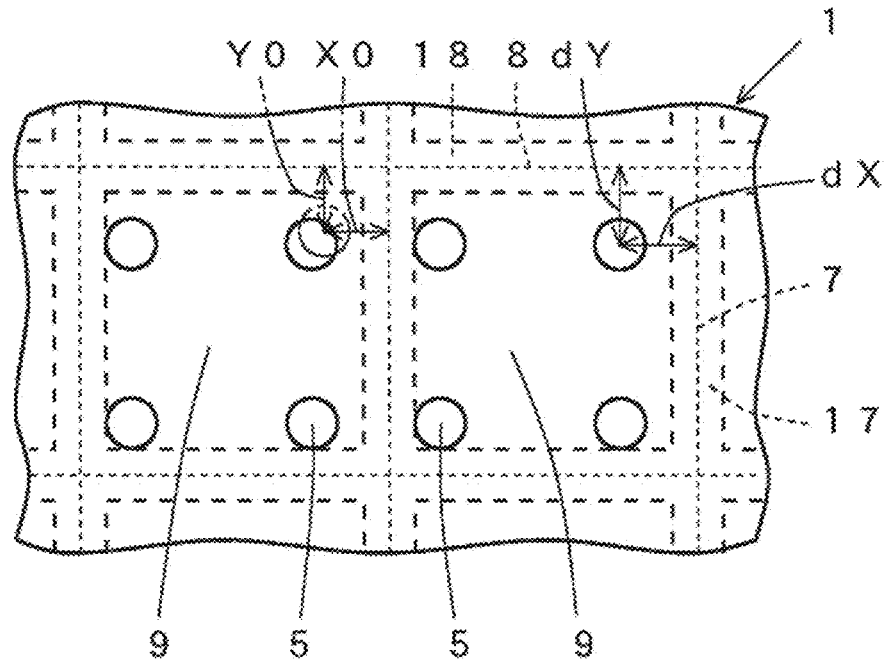

FIG. 5B shows the case where 0<(dX−X0)<T1 and 0<(dY−Y0)<T1. In this case, solder ball 5 is displaced from first cutting line 7 by −(dX−X0) in the X direction and from second cutting line 8 by −(dY−Y0) in the Y direction. Solder ball 5 is slightly displaced from the prescribed position in each of the X direction and the Y direction, but formed within the permissible range. Therefore, BGA substrate 1 is cut and singularized along first cutting line 7 extending in the shorter direction of BGA substrate 1 and second cutting line 8 extending in the longer direction thereof. Also in this case, since the displacement amount of solder ball 5 relative to each of first cutting line 7 and second cutting line 8 falls within the permissible range, no defective product is produced.

Also in each case of FIGS. 5A and 5B, the displacement amount of solder ball 5 falls within the permissible range of the product. Therefore, BGA substrate 1 can be cut and singularized along first cutting line 7 extending in the shorter direction of BGA substrate 1 and second cutting line 8 extending in the longer direction thereof. Since the displacement amount of solder ball 5 falls within the permissible range, no defective product is produced in each of the above-described cases.

Figure 5C:
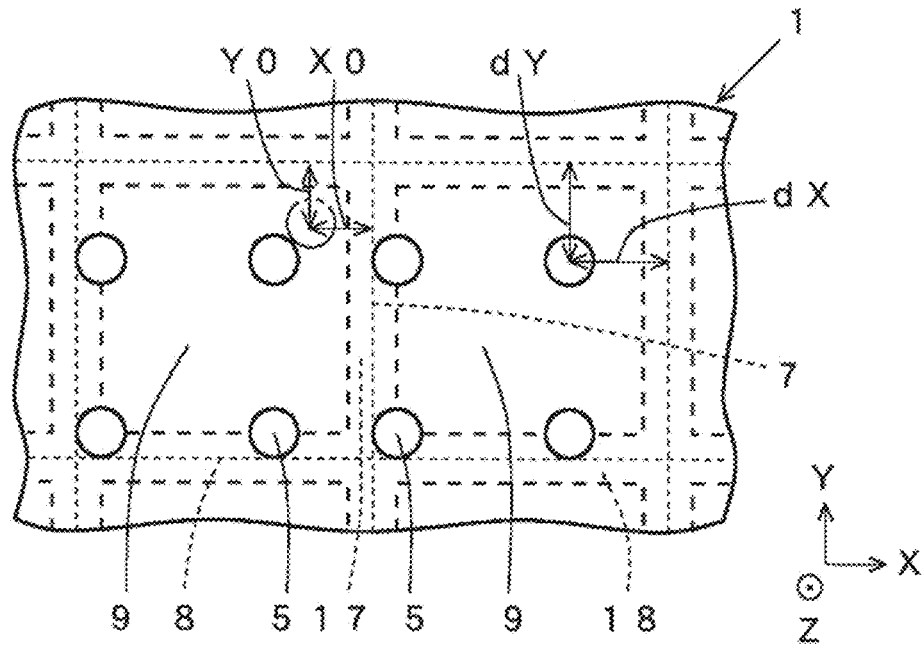

FIG. 5C shows the case where (dX−X0)>T1 and (dY−Y0)>T1. In this case, each of the displacement amounts of solder ball 5 in the X direction and the Y direction falls beyond a permissible value T1. When BGA substrate 1 is cut along first cutting line 7 and second cutting line 8 in this state, a part of solder ball 5 may be damaged to thereby produce a defective product. In such a case, BGA substrate 1 cannot be cut along first cutting line 7 and second cutting line 8 that have been originally set. Therefore, first cutting line 7 and second cutting line 8 that have been originally set need to be corrected for cutting BGA substrate 1.

In addition, FIG. 5C shows the case where (dX−X0)>T1 and (dY−Y0)>T1. Therefore, in this case, each of the displacement amounts of solder ball 5 in the X direction and the Y direction is beyond permissible value T1. If one of (dX−X0)>T1 and (dY−Y0)>T1 is established, the displacement amount of solder ball 5 in one of the X direction and the Y direction is beyond permissible value T1. If one of the displacement amounts exceeds permissible value T1, at least this one of the displacement amounts, preferably both of the displacement amounts, is corrected for cutting BGA substrate 1.

Figure 5D:
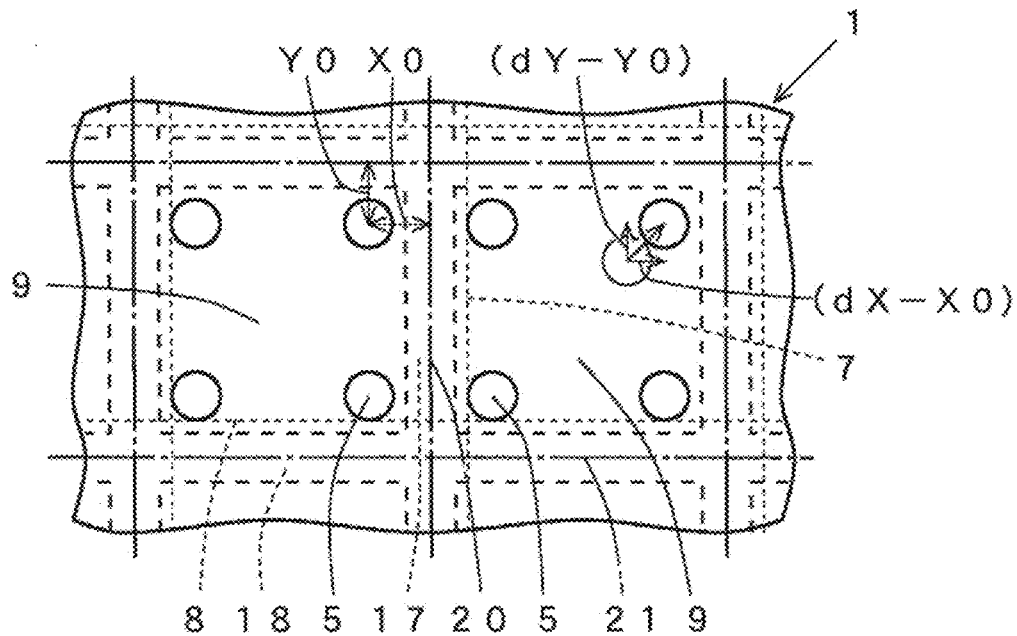

As shown in FIG. 5D, the displacement amount in the X direction is −(dX−X0)>T1 and the displacement amount in the Y direction is −(dY−Y0>T1. Thus, these displacement amounts are corrected. First, BGA substrate 1 is picked up by the conveyance mechanism (see conveyance mechanism 125 in FIG. 1) from cutting jig 11. Then, in the state where BGA substrate 1 is held, BGA substrate is moved by +(dX−X0) in the X direction and by +(dY−Y0) in the Y direction. Thereby, BGA substrate 1 is moved to a target position. By such a movement, a new cutting line (a line shown by a thick dashed and dotted line in FIG. 5D) can be set on a line connecting intermediate points each located between solder balls 5 formed in regions adjacent to each other. In BGA substrate 1, a plurality of new third cutting lines 20 are set in the shorter direction and a plurality of new fourth cutting lines 21 are set in the longer direction. The plurality of third cutting lines 20 and the plurality of fourth cutting lines 21 are located on the plurality of cutting grooves 17 and the plurality of cutting grooves 18, respectively.

The conveyance mechanism is used to pick up BGA substrate 1 and move BGA substrate 1 by an appropriate amount depending on the displacement amount, so that third cutting lines 20 and fourth cutting lines 21 can be placed on first cutting grooves 17 and second cutting grooves 18, respectively, formed in cutting jig 11. BGA substrate 1 is again placed on cutting jig 11 and cut along the plurality of third cutting lines 20 and the plurality of fourth cutting lines 21. Thereby, each solder ball 5 is prevented from being damaged, so that occurrence of a defective product can be prevented. Since the rotary blade of the cutting mechanism is prevented from shaving resin sheet 13 of cutting jig 11, the life of cutting jig 11 can be lengthened. In addition, BGA substrate 1 is placed on cutting jig 11 in the state where each first cutting line 7 extending in the shorter direction is moved by +(dX−X0) from its original position in the X direction and each second cutting line 8 extending in the longer direction is moved from its original position by +(dY−Y0) in the Y direction.

According to the configuration of each of the conveyance mechanism (see conveyance mechanism 125 in FIG. 1) and cutting jig 11 (see FIG. 4), in the state where BGA substrate 1 is picked up from cutting jig 11 by the conveyance mechanism and held by this conveyance mechanism, cutting jig 11 may be moved by an appropriate amount depending on the displacement amount of solder ball 5 in at least one of the X direction, the Y direction and the θ direction. Then, BGA substrate 1 is again placed on cutting jig 11 using the conveyance mechanism.

Essentially, in the state where BGA substrate 1 is picked up from cutting jig 11 by the conveyance mechanism and held by this conveyance mechanism, the conveyance mechanism and cutting jig 11 may be moved relative to each other by an appropriate amount depending on the displacement amount in at least one of the X direction, the Y direction and the θ direction.

Figure 7:
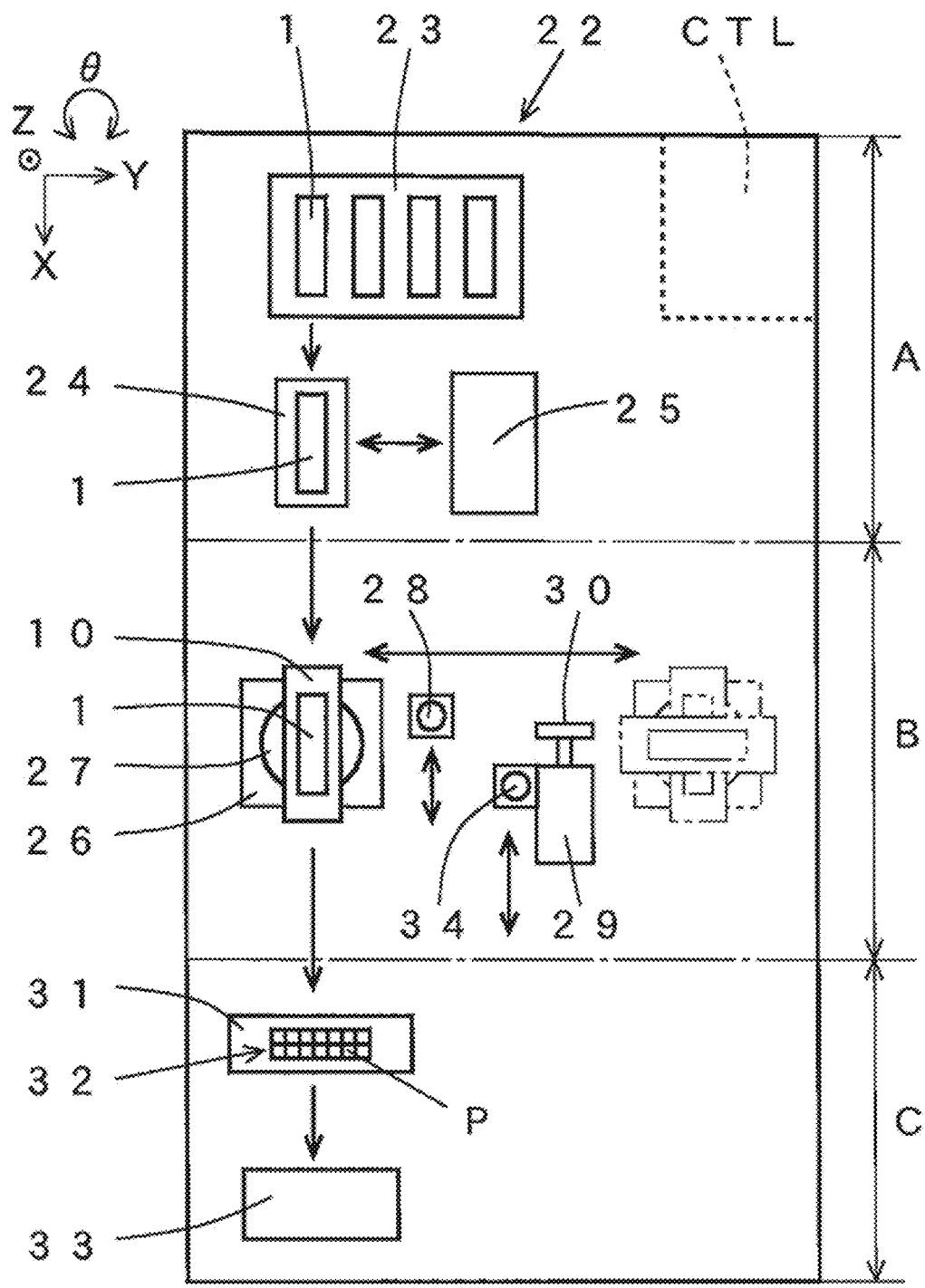
FIG. 7 is a plan view showing an outline of a cutting device according to the second embodiment of the present invention.

The conveyance mechanism is shown as a "conveyance mechanism 25" in FIG. 7 as a representative example. The positional error between the conveyance mechanism and cutting jig 11 caused by relative movement of the conveyance mechanism and cutting jig 11 (the displacement amount between the position where each component should essentially be located and the position where each component is actual located) is sufficiently small enough to be negligible as compared with the displacement amount of BGA substrate 1 relative to cutting jig 11 and the displacement amount of solder ball 5 in BGA substrate 1. For example, the positional error caused when the conveyance mechanism and cutting jig 11 are repeatedly moved so as to establish the same positional relation is sufficiently small enough to be negligible as compared with the displacement amount of BGA substrate 1 relative to cutting jig 11 and the displacement amount of solder ball 5 in BGA substrate 1.

Figure 6A:
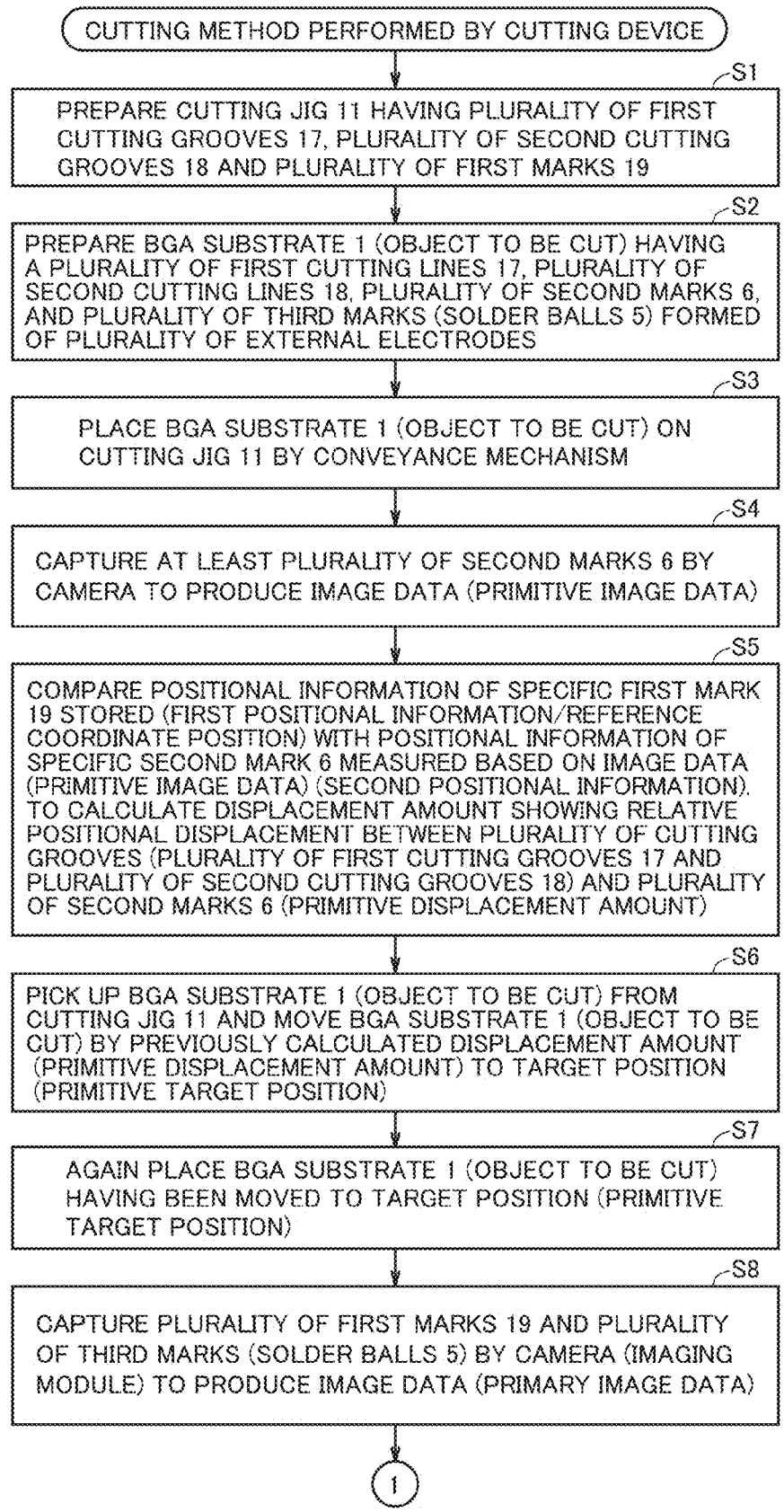
FIGS. 6A and 6B are flow charts each showing the procedure of a cutting method performed in the cutting device according to the first embodiment of the present invention.
Figure 6B:
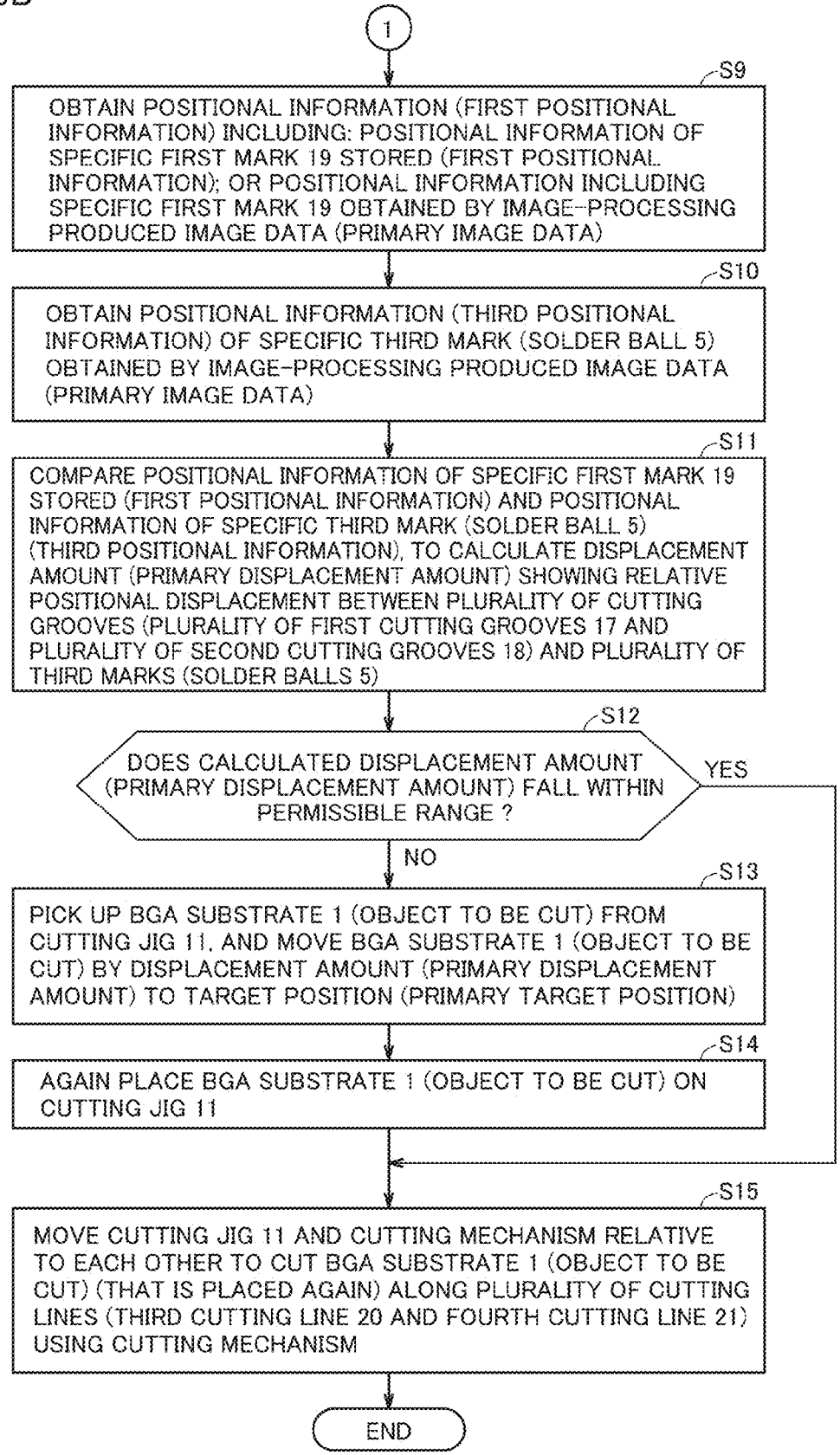

Referring to FIGS. 6A and 6B, according to the first embodiment, cutting jig 11 adaptable to a product is mounted on cutting table 10 (see step S1 in FIG. 6A). A plurality of first marks 19 are provided in cutting jig 11 so as to be capable of corresponding to a plurality of second marks 6, respectively, formed in BGA substrate 1. In cutting table 10, the coordinate position of first mark 19 formed in cutting jig 11 is measured and stored in advance as a reference coordinate position. Then, the coordinate position of second mark 6 in BGA substrate 1 placed on cutting jig 11 is measured (see steps S2 to S4 in FIG. 6A). The coordinate position of first mark 19 is compared with the coordinate position of second mark 6, so that the displacement amount of BGA substrate 1 in cutting jig 11 can be calculated (see step S5 in FIG. 6A). When the displacement amount of BGA substrate 1 is beyond the permissible value, the displacement amount is corrected, so that the position of second mark 6 in BGA substrate 1 can be accurately aligned with the position of first mark 19 in cutting jig 11 (see steps S6 and S7 in FIG. 6A). Thereby, the positions of the plurality of cutting lines set in BGA substrate 1 are accurately aligned with the positions of the plurality of cutting grooves provided in cutting jig 11.

In the state where the positions of the plurality of cutting lines in BGA substrate 1 are accurately aligned with the positions of the plurality of cutting grooves in cutting jig 11, the coordinate position of solder ball 5 formed in BGA substrate 1 is measured (see steps S8 to S10 in FIGS. 6A and 6B). The measured coordinate position of solder ball 5 is compared with the coordinate position of each cutting line, to calculate the distance from each cutting line to solder ball 5. This distance is compared with the distance extending from each cutting line to the solder ball in the product and stored in controller 100 in advance (the specification value of the product), to calculate the displacement amount of solder ball 5 (see step S11 in FIG. 6B). Controller 100 determines whether the calculated displacement amount falls within a permissible range (see step S12 in FIG. 6B). If the calculated displacement amount falls within the permissible range, BGA substrate 1 is cut and singularized along each cutting line (see step S15 in FIG. 6B). If the calculated displacement amount is beyond the permissible range, BGA substrate 1 is picked up from cutting jig 11 using the conveyance mechanism, moved by an appropriate amount depending on the displacement amount, and then, again placed at the target position in cutting jig 11 (steps S13 and S14 in FIG. 6B). Thereby, a new cutting line can be set on a line connecting intermediate points each located between solder balls 5 formed in regions 9 adjacent to each other. Each new cutting line is accurately aligned with the position of each cutting groove in cutting jig 11. As BGA substrate 1 is cut and singularized along these cutting lines, solder balls 5 are not damaged, so that occurrence of a defective product can be prevented.

According to the first embodiment, even when solder ball 5 is displaced from each original cutting line, BGA substrate 1 is moved by an appropriate amount depending on the displacement amount, to set a new cutting line on a line connecting intermediate points each located between solder balls 5 formed in regions 9 adjacent to each other. Thereby, the position of each new cutting line can be aligned with the position of each cutting groove in cutting jig 11. Therefore, BGA substrate 1 can be cut along each new cutting line without displacement of the rotary blade provided in the cutting mechanism from the position of each cutting groove. Since solder ball 5 is not damaged, occurrence of a defective product can be prevented. In addition, cutting jig 11 can be prevented from being shaved by a rotary blade. This eliminates generation of scraps from cutting jig 11. Since the rotary blade is prevented from shaving cutting jig 11, the life of cutting jig 11 is lengthened, so that the operation cost for the cutting device can be reduced.

In the first embodiment, the coordinate positions of the plurality of second marks 6 formed in BGA substrate 1 are first measured, to calculate the displacement amount of BGA substrate 1 in cutting jig 11. When the displacement amount of BGA substrate 1 is beyond the permissible value, this displacement amount is corrected, thereby aligning the positions of the plurality of cutting lines provided in BGA substrate 1 with the positions of the plurality of cutting grooves provided in cutting jig 11. Then, the coordinate position of solder ball 5 formed in BGA substrate 1 is measured, to calculate the distance from each cutting line to solder ball 5. When the displacement amount of solder ball 5 is beyond the permissible value, this displacement amount is corrected to thereby set a plurality of new cutting lines on BGA substrate 1. The positions of such plurality of newlyset cutting lines are aligned with the positions of the plurality of cutting grooves in cutting jig 11, and then, BGA substrate 1 is cut and singularized.

Modification of First Embodiment

As a modification of the first embodiment, the displacement amount of solder ball 5 can be corrected in the following manner.

As the first modification, the coordinate position of first mark 19 provided in cutting jig 11, the coordinate position of second mark 6 in BGA substrate 1 placed on cutting jig 11, and the coordinate position of solder ball 5 are measured. Controller 100 performs data processing of each of the measured coordinate positions, thereby calculating a relative displacement amount between solder ball 5 and each cutting groove. The displacement amount of solder ball 5 is corrected, to set a cutting line on a line connecting intermediate points each located between solder balls 5 formed in regions 9 adjacent to each other. Thus, BGA substrate 1 can be cut.

In this case, the coordinate position of first mark 19 provided in cutting jig 11, the coordinate position of second mark 6 in BGA substrate 1 placed on cutting jig 11 and the coordinate position of solder ball 5 are measured in each of different processes. Without limiting to the above, in the state where BGA substrate 1 is placed on cutting jig 11, the coordinate position of first mark 19, the coordinate position of second mark 6 and the coordinate position of solder ball 5 can be simultaneously measured to calculate the relative displacement amount between solder ball 5 and each cutting groove.

As the second modification, the coordinate position of first mark 19 provided in cutting jig 11 and the coordinate position of solder ball 5 in BGA substrate 1 placed on cutting jig 11 are measured. Controller 100 compares the measured coordinate positions, to calculate the displacement amount between solder ball 5 and each cutting groove. By correcting the displacement amount of solder ball 5, a cutting line can be set on a line connecting intermediate points each located between solder balls 5 formed in regions 9 adjacent to each other, for cutting BGA substrate 1. Also in this case, in the state where BGA substrate 1 is placed on cutting jig 11, the coordinate position of first mark 19 and the coordinate position of solder ball 5 may be simultaneously measured, to calculate the displacement amount between solder ball 5 and each cutting groove.

Second Embodiment

The cutting device according to the second embodiment of the present invention will be hereinafter described with reference to FIG. 7. As shown in FIG. 7, cutting device 22 serves to singularize an object to be cut into a plurality of products. Cutting device 22 includes a substrate feeding module A, a substrate cutting module B, and a checking module C as components. These components (each of modules A to C) are attachable to/detachable from and exchangeable with each other.

Substrate feeding module A is equipped with: a substrate feeding mechanism 23 feeding BGA substrate 1 corresponding to an object to be cut; a substrate placement unit 24 delivering BGA substrate 1; and a conveyance mechanism 25 conveying BGA substrate 1. BGA substrate 1 is fed in the state where the side of substrate 2 having solder ball 5 (see FIGS. 2A and 2B) formed thereon faces up. Conveyance mechanism 25 is movable in the X direction, the Y direction and the Z direction, and rotatable in the θ direction. After BGA substrate 1 is positioned in substrate placement unit 24, it is conveyed by conveyance mechanism 25 to substrate cutting module B.

Cutting device 22 shown in FIG. 7 is a cutting device of a single cut table-type. Accordingly, one cutting table 10 is provided in substrate cutting module B. Cutting table 10 is movable in the Y direction in FIG. 7 by movement mechanism 26, and also rotatable in the θ direction by rotation mechanism 27. Cutting jig 11 (see FIGS. 3A and 3B) is mounted on cutting table 10, and BGA substrate 1 is placed on cutting jig 11 and adhered thereto by means of vacuum sucking.

Substrate cutting module B is equipped with alignment camera 28. Camera 28 is independently movable in the X direction. Substrate cutting module B is provided with a spindle 29 as a cutting mechanism. Cutting device 22 has a single spindle configuration provided with one spindle 29. Spindle 29 is independently movable in each of the X direction and the Z direction. Spindle 29 is equipped with a rotary blade 30. Spindle 29 is provided with a nozzle for cutting water (not shown) that sprays cutting water for suppressing frictional heat generated by rapidly-spinning rotary blade 30. Cutting table 10 and spindle 29 are moved relative to each other, so that BGA substrate 1 is cut. Rotary blade 30 rotates in a plane including the Y direction and the Z direction, thereby cutting BGA substrate 1.

Checking module C is provided with a checking table 31. An assembly made of a plurality of products P obtained by cutting and singularizing BGA substrate 1, that is, BGA substrate having been cut 32, is placed on checking table 31. The plurality of products P are checked by a checking camera (not shown) and sorted into non defective products and defective products. Non-defective produces are stored in a tray 33.

Spindle 29 is provided with a camera 34 for kerf checking. Camera 34 takes an image of solder ball 5 immediately before BGA substrate 1 is cut. Camera 28 or camera 34 moves in the X direction and cutting table 10 moves in the Y direction, to take an image of second mark 6 (see FIG. 2A) formed in BGA substrate 1. A controller CTL measures the coordinate position of second mark 6 based on the image data obtained by capturing. Controller CTL compares the coordinate position of second mark 6 with the coordinate position of first mark 19 (see FIG. 3A) formed in cutting jig 11 and measured and stored in advance, to align cutting jig 11 and BGA substrate 1 (alignment between each cutting groove and each cutting line). Camera 28 or camera 34 subsequently takes an image of solder ball 5. Controller CTL measures the coordinate position of solder ball 5 based on the image data obtained by capturing. When solder ball 5 is unacceptably displaced, the position of each cutting line is corrected, and then, BGA substrate 1 is cut by rotary blade 30.

In the second embodiment, controller CTL is provided inside substrate feeding module A. This controller CTL performs: an operation of cutting device 22; conveyance of BGA substrate 1; alignment of BGA substrate 1; correction of the displacement amount of the solder ball; cutting of BGA substrate 1; checking of product and the like. Without limiting to the above, controller CTL may be provided inside a different module.

In the second embodiment, cutting device 22 that is of a single cut table-type and has a single spindle configuration has been described. Without limiting to the above, alignment, cutting and the like of BGA substrate 1 in the present invention can be applicable also to a cutting device that is of a single cut table-type and has a twin spindle configuration, and to a cutting device that is of a twin cut table-type and has a twin spindle configuration, or the like.

According to the second embodiment, in cutting device 22, conveyance mechanism 25 is movable in the X direction, the Y direction and the Z direction, and also rotatable in the θ direction. Thereby, even when BGA substrate 1 is displaced from a prescribed position of cutting jig 11 or when solder ball 5 is displaced from a cutting line, such displacement amounts can be corrected by conveyance mechanism 25. BGA substrate 1 is picked up by conveyance mechanism 25 in the state where this BGA substrate 1 is kept displaced or solder ball 5 is kept displaced. From this state, conveyance mechanism 25 is moved by an appropriate amount depending on the displacement amount of the BGA substrate or the displacement amount of solder ball 5, and stopped above the prescribed position of cutting jig 11. Then, BGA substrate 1 is again placed on cutting jig 11. Since BGA substrate 1 can be placed at the prescribed position of cutting jig 11, the position of the cutting line that should be cut can be correctly aligned with the position of the cutting groove in cutting jig 11. BGA substrate 1 can be accurately aligned without having to add a new component and a new function to existing cutting device 22. BGA substrate 1 can be aligned without having to modify cutting device 22 and having to incur additional cost. Therefore, the cutting quality and the product yield can be improved without incurring costs for modifying cutting device 22.

According to the second embodiment, BGA substrate 1 can be cut in the state where the position of each cutting line in BGA substrate 1 is correctly aligned with the position of each cutting groove in cutting jig 11. Therefore, since solder ball 5 is not damaged, occurrence of defective products can be prevented. In addition, the rotary blade can be prevented from shaving resin sheet 13. Generation of scraps from cutting jig 11 can also be prevented. Since the rotary blade is prevented from shaving resin sheet 13, the life of cutting jig 11 is lengthened, so that the operation cost for cutting device 22 can be reduced.

In the second embodiment, conveyance mechanism 25 corrects the displacement amount of BGA substrate 1 in each of the X direction, the Y direction and the θ direction, and moves BGA substrate 1 to above the prescribed position of cutting jig 11 and placed thereon. Without limiting to the above, conveyance mechanism 25 may correct the displacement amount of BGA substrate 1 in the X direction, and cutting table 10 may correct the displacement amounts in the Y direction and the θ direction, so that BGA substrate 1 can be placed at the prescribed position on cutting jig 11. In such a case, the conveyance mechanism may be configured so as to be movable only in the X direction.

Other Embodiments

Each embodiment as described above has presented a BGA substrate, as an object to be cut, that has a rectangular planar shape having a longer direction and a shorter direction. Without limiting to the above, the present invention can be applicable also to the case where a BGA substrate having a square planar shape is provided as an object to be cut. Furthermore, the present invention can be applicable to the case where a general BGA product such as a PBGA (Plastic Ball Grid Array), a P-FBGA (Plastic Fine pitch Ball Grid Array), an FC-BGA (Flip Chip-Ball Grid Array), and a C-BGA (Ceramic Ball Grid Array) are manufactured.

In addition, the present invention can be applicable also to the case where an LGA (Land Grid Array), a PoP (Package on a Package), a PiP (Package in a Package), and the like are manufactured. In these cases, a lead (external electrode) and the like exposed from sealing resin are used as the third mark as an object to be captured. According to the present invention, also when an object to be cut is a BGA substrate, the object to be cut can be cut while correcting the positional displacements of a solder ball, a lead and the like resulting from shrinkage of the substrate.

In each embodiment described above, cutting jig 11 having metal plate 12 and resin sheet 13 fixed on this metal plate 12 is mounted on cutting table 10. Without limiting to the above, cutting jig 11 formed of one type of metal or a plurality of types of metals, that is, cutting jig 11 made of metal, can be used. Cutting jig 11 formed of one type of resin or a plurality of types of resins, that is, cutting jig 11 made of resin, can be used. Without having to use cutting table 10, the main body of cutting jig 11 may be directly moved by movement mechanism 26 and rotation mechanism 27.

In each embodiment described above, a rotary blade is used as a cutting mechanism. Without limiting to the above, a wire saw, a band saw, laser light, a water jet, blasting and the like may be used. When a wire saw and a band saw are used, the cutting jig is provided with a through hole as space through which a blade as means contributing to cutting (a wire saw and a band saw) passes. When laser light, a water jet or blasting is used, the cutting jig is provided with a through hole as space through which these means contributing to cutting passes. According to the above, the "cutting groove" of the present invention includes a slit-shaped through hole passing through a "cutting jig". At least a part of the means contributing to cutting (a rotary blade, a wire saw, a band saw, and the like) included in the cutting mechanism passes through the "cutting groove". At least a part of the means contributing to cutting (laser light, high-pressure injection water, abrasive grains, and the like) supplied from the cutting mechanism passes through the "cutting groove".

The present invention is not limited to each embodiment as described above, but can be employed by arbitrarily and appropriately combining, modifying or selecting the embodiments as required within the range not deviating from the meaning of the present invention.

Although the embodiments of the present invention have been described as above, it should be understood that the embodiments disclosed herein are illustrative and non-restrictive in every respect. The scope of the present invention is defined by the terms of the claims, and is intended to include any modifications within the meaning and scope equivalent to the terms of the claims.

The invention claimed is:

1. A cutting device used when manufacturing a plurality of products by cutting an object to be cut, the cutting device comprising:
   a cutting jig having a plurality of first marks and a plurality of cutting grooves and on which an object to be cut is placed, the object having a plurality of second marks and a plurality of third marks formed of a plurality of external electrodes;
   a cutting mechanism for cutting the object, which is placed on the cutting jig, along a plurality of cutting lines;
   a conveyance mechanism for conveying the object;
   a movement mechanism for moving the cutting jig and the cutting mechanism relative to each other;
   an imaging module for capturing at least the plurality of first marks and the plurality of third marks, to produce primary image data; and a control module for causing the conveyance mechanism to align the cutting jig and the object that is placed on the cutting jig, wherein the control module is adapted to compare (a) first positional information including positional information of a specific first mark stored or (b) first positional information including positional information of a specific first mark obtained by image-processing the primary image data, with third positional information including positional information of a specific third mark measured based on the primary image data, to calculate a primary displacement amount showing a relative positional displacement between the plurality of cutting grooves and the plurality of third marks, respectively, the conveyance mechanism is adapted to move the object to a primary target position depending on the primary displacement amount by means that the object is picked up from the cutting jig and the conveyance mechanism and the cutting jig are moved relative to each other based on the primary displacement amount, and then again place the object on the cutting jig, and the cutting mechanism is adapted to cut the object, which is placed again, along the plurality of cutting lines.

2. The cutting device according to claim 1, wherein before producing the primary image data, the imaging module captures at least the plurality of second marks to produce primitive image data, before producing the primary image data, the control module compares the first positional information and second positional information including positional information of a specific second mark measured based on the primitive image data, to calculate a primitive displacement amount showing a relative positional displacement between the plurality of cutting grooves and the plurality of second marks, respectively, and before producing the primary image data, the conveyance mechanism moves the object to a primitive target position depending on the primitive displacement amount by means that the object is picked up from the cutting jig and the conveyance mechanism and the cutting jig are moved relative to each other based on the primitive displacement amount, and then again places the object on the cutting jig.

3. The cutting device according to claim 1, wherein the object is moved to the primitive target position or the primary target position in at least one of an X direction, a Y direction and a θ direction by means that the conveyance mechanism and the cutting jig are moved relative to each other, and then the conveyance mechanism again places the object on the cutting jig.

4. The cutting device according to claim 1, wherein at least two specific first marks are set in each of a first direction and a second direction that is orthogonal to the first direction as seen in plan view, at least two specific second marks are set in each of the first direction and the second direction as seen in plan view, and at least two specific third marks are set in each of the first direction and the second direction as seen in plan view.

5. The cutting device according to claim 1, wherein the object is a sealed substrate used when manufacturing a BGA, and the external electrode is an electrode having a protruded shape.

* * * * *